United States Patent
Deleonibus

(10) Patent No.: US 6,867,128 B2
(45) Date of Patent: Mar. 15, 2005

(54) METHOD FOR MAKING AN ELECTRONIC COMPONENT WITH SELF-ALIGNED DRAIN AND GATE, IN DAMASCENE ARCHITECTURE

(75) Inventor: Simon Deleonibus, Claix (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/030,175
(22) PCT Filed: Jun. 8, 2001
(86) PCT No.: PCT/FR01/01776
§ 371 (c)(1), (2), (4) Date: Jan. 31, 2002
(87) PCT Pub. No.: WO01/95383
PCT Pub. Date: Dec. 13, 2001

(65) Prior Publication Data
US 2003/0008496 A1 Jan. 9, 2003

(30) Foreign Application Priority Data
Jun. 9, 2000 (FR) .............................. 00 07419

(51) Int. Cl.⁷ ......................................... H01L 21/4763
(52) U.S. Cl. ...................................... 438/635; 438/785
(58) Field of Search ................................ 438/635, 785, 438/778, 630, 149, 151, 157, 183–5, 197, 201, 211, 229–33, 257–8, 265–6, 283, 301–7, 585, 591, 605, 618, 621, 626, 648–9, 595

(56) References Cited

U.S. PATENT DOCUMENTS

| | | | |
|---|---|---|---|
| 5,391,510 A | 2/1995 | Mathad et al. | |
| 5,955,759 A * | 9/1999 | Ismail et al. | 257/332 |
| 5,960,270 A * | 9/1999 | Misra et al. | 438/197 |
| 6,033,963 A | 3/2000 | Chen et al. | |
| 6,200,865 B1 * | 3/2001 | Gardner et al. | 438/291 |
| 6,271,094 B1 * | 8/2001 | Boyd et al. | 438/287 |
| 6,346,450 B1 | 2/2002 | Deleonibus et al. | |
| 6,544,827 B2 * | 4/2003 | Abiko | 438/183 |

FOREIGN PATENT DOCUMENTS

| | | |
|---|---|---|
| FR | 2 750 534 | 1/1998 |
| FR | 2 757 312 | 6/1998 |

* cited by examiner

Primary Examiner—Long Pham
Assistant Examiner—Ginette Peralta
(74) Attorney, Agent, or Firm—Oblon, Spivak, McClelland, Maier & Neustadt, P.C.

(57) ABSTRACT

A method for fabricating an electronic component with a self-aligned source, drain and gate. The method includes forming a dummy gate on a silicon substrate, in which the dummy gate defines a position for a channel of the component. The method also includes at least one implantation of doping impurities in the substrate, to form a source and a drain on either side of the channel, using the dummy gate as an implanting mask, superficial, self-aligned siliciding of the source and drain, depositing at least one contact metal layer having a total thickness greater than a height of the dummy gate, polishing the at least one contact metal layer stopping at the dummy gate, and replacing the dummy gate by at least one final gate separated from the substrate by a gate insulating layer, and electrically insulated from the source and drain. Further, depositing the at least one contact metal layer includes depositing a first metal layer and, above the first metal layer, a second metal layer having a greater mechanical resistance to polishing than the first metal layer. In addition, a thickness of the first metal layer is less than the height of the dummy gate, and a total thickness of the first and second layers is greater than the height of the dummy gate. Further, the first metal is chosen from among tungsten and titanium, and the second metal is chosen from among TaN, Ta and TiN.

11 Claims, 5 Drawing Sheets

METHOD FOR MAKING AN ELECTRONIC COMPONENT WITH SELF-ALIGNED DRAIN AND GATE, IN DAMASCENE ARCHITECTURE

TECHNICAL FIELD

The present invention concerns a method for fabricating electronic components with self-aligned source, drain and gate. The components concerned by the invention may be insulated gate transistors such as MOS transistors (Metal Oxide Semiconductor) for example, or electronic memories with a dual gate, that is to say with a command gate and a floating gate.

The method of the invention particularly concerns the fabrication of these components on a solid silicon substrate or on a thin layer substrate such as a substrate of SOI type (Silicon on Insulator).

The invention finds applications in numerous microelectronic areas, ranging from power switching to hyperfrequency circuits, not forgetting memory circuits.

STATE OF PRIOR ART

Methods for producing transistors using self-aligning techniques are known, for example, from documents (1) and (2) whose references are given at the end of this description.

Document (1) in particular, concerns the fabrication of a MIS transistor (Metal Insulator Semiconductor). It describes a method according to which a dummy gate is used to fix the location and size of a final gate that is subsequently formed. The final gate is preferably in a material having low resistivity, such as metal for example, so as to reduce gate resistance and to increase the cut-off frequency of the transistor.

Document (2) indicates a method which suggests siliciding the source and drain regions, so that the source and drain access resistances can also be reduced. The method of document (2) remains relatively complex however.

DISCLOSURE OF THE INVENTION

The invention sets out to propose a method for fabricating components which is different to the methods described in the documents indicated above, and with which it is possible to further reduce gate, source and drain resistances.

Another purpose is to put forward such a method whose application is simplified.

A further purpose is to make available such a method which allows greater miniaturization of the components and therefore greater circuit integration.

Finally, another purpose, connected with the above aspects, is to put forward a method with which it is possible to obtain transistors having a particularly high cut-off frequency.

To achieve these purposes, the subject of the invention is more precisely a method for fabricating an electronic component with self-aligned source, drain and gate, comprising the following steps:

a) forming a dummy gate on a silicon substrate, said dummy gate defining a location for a channel of the component, b) implanting doping impurities in the substrate, to form a source and drain either side of the channel, using the dummy gate as implanting mask, c) self-aligned superficial siliciding of the source and drain, d) depositing at least one, so-called contact, metal layer, whose total thickness is greater than the height of the dummy gate, and polishing the metal layer stopping at the dummy gate.

e) replacing the dummy gate by at least one final gate, separated from the substrate by a gate insulating layer, and electrically insulated from the source and drain.

By means of the contact metal layer, but also on account of the self-aligned siliciding of the source and drain, the access resistance of the source and drain may be particularly reduced despite the very small dimensions of the component.

In addition, by having recourse to a dummy gate, it is possible, at the end of the method, to obtain a final gate that is self-aligned on the source and drain regions. This type of structure is particularly suited to reduced component sizes, and in particular to gate lengths of less than 0.10 $\mu$m.

According to one particular embodiment of the method, the formation of the dummy gate may advantageously comprise the depositing of a first layer of material, a so-called stress adaptation layer, and of a second layer of material, a so-called polish stop layer, and the forming of these layers by etching using a mask defining the dimensions, the shape and positioning of the gate.

At first view the essential role of the dummy gate is simply to "reserve a site" for the final gate that is subsequently made. However, the choice of a dual-layer dummy gate facilitates the subsequent steps of the method. The first layer is preferably a layer having a coefficient of thermal expansion and an average mesh parameter close to that of the material of the substrate. For monocrystalline silicon substrates, the stress adaptation layer may therefore, for example, be a layer of amorphous or polycrystalline silicon. In addition, the depositing technique for these materials is easy to implement and well known.

The material of the second layer may, preferably, be chosen to have good resistance to abrasion and polishing. It therefore provides for better use of the dummy gate as stop mark during the polishing operation of the contact metal.

According to another aspect of the invention, the sides of the dummy gate may be lined with one or more layers of side spacers. By layer of side spacers is meant a layer of dielectric material which lines the side walls of a gate, that is to say the sides substantially perpendicular to the substrate carrying the gate. Advantage may be taken of the layers of side spacers when forming the source and drain, by using them as additional implanting masks. The use of side spacers for implantation, known in itself, makes it possible to obtain source and drain regions having gradual impurity concentrations.

Within the scope of the invention, when placed in position before siliciding, the spacers also protect the dummy gate from siliciding, and provide for a greater choice of materials for the latter.

Finally, the side spacers may advantageously be used in the remainder of the method as electric insulating means for the final gate from the layer of contact metal.

The side spacers may be single layer spacers or, preferably, twin-layer spacers. Here again, a first layer of silicon oxide makes it possible to limit contact stresses with the gate and substrate—the spacers effectively coming into contact with a small portion of the substrate. A second layer of silicon nitride on the other hand is well adapted to protecting the dummy gate both against oxidation and against siliciding.

Step d) mentioned above for depositing the contact metal may, according to one improvement, include the depositing of a first layer of metal then, on top of the first layer, the depositing of a second metal layer having mechanical resistance to polishing that is greater than that of the first layer. The thickness of the first metal layer is therefore chosen to be smaller than the height of the dummy gate. However, the total thickness of the first and second layers is greater than the height of the dummy gate.

The purpose of the second metal layer is to reduce the so-called "dishing" phenomenon of polishing. This phenomenon leads to faster erosion of the polished material in the higher step regions than in the low regions. In other words, the depositing of two contact metal layers under the above-described conditions makes it possible, after polishing, to obtain a free surface having excellent planarity.

The contact metal, or at least the first layer of this metal, extends the source and drain providing for very low access resistance to these regions.

When polishing reaches the top of the dummy gate, or starts to enter it, it produces separation in the gate region of the metal in contact with the source from the metal in contact with the drain. Further etching (which does not directly form part of the method of the invention) makes it possible to cut the contact metal outside the active region crossed by the gate, and hence to complete the electric insulation between drain and source.

The layers of contact metal are formed before the replacement of the dummy gate by the final gate. Therefore, in order to prevent the material of the final gate, preferably having low resistivity, from short-circuiting the source and drain, it is necessary to provide for surface insulation or the contact layers in the source and drain regions. This operation could optionally be conducted by depositing a layer of dielectric material. According to one particular aspect of the invention however, the method may comprise superficial oxidation of the metal layers. Oxidation can provide a simple, sure guarantee of electric insulation between source, gate and drain. In addition it avoids any masking operation.

In the subsequent steps of the fabrication of the component, it is possible to make openings in the oxide of the contact metal layers to insert contact points for interconnection lines.

The removal of the dummy gate may comprise one or more selective etching operations to remove its component layers. This is followed by the placing in position of a gate insulation layer on the substrate, in the well left by the dummy gate.

A following step consists of placing in position one or more layers of conductor material, or at least having low resistivity, optionally separated by a dielectric layer. These layers form one or more gates.

More precisely, when the component it is desired to produce is a transistor, one or more conductor layers are provided to form a single gate.

On the other hand, if the desired component is a memory, it is possible firstly to deposit a first conductor layer and then a second conductor layer, separated from the first conductor layer by a layer of dielectric material. The first and second conductor layers then respectively form the floating and command gates. The dielectric layer forms an inter-gate insulating layer.

It is to be specified that the conductor and dielectric layers mentioned above may be homogeneous or they may be formed of stacks of several sub-layers.

The layer or layers which form the gate structure are preferably deposited with an overall thickness that is the same as or more than the height of the removed dummy gate, so as to be able to undergo polishing.

Other characteristics and advantages of the invention will become apparent on reading the following description, with reference to the figures of the appended drawings. This description is solely given for illustrative purposes and is non-restrictive.

SHORT DESCRIPTION OF THE FIGURES

DETAILED DESCRIPTION OF EMBODIMENTS OF THE INVENTION

Identical, similar or equivalent parts in the figures described below carry the same numerical references so as to facilitate cross-referencing from one figure to another. Also, even though the following description only concerns the fabrication of components on a solid substrate, in silicon in this case, it is to be emphasized that the methods remain the same for forming components on insulated thin layer substrates, such as substrates of SOI type (Silicon On Insulator).

Figure 1:
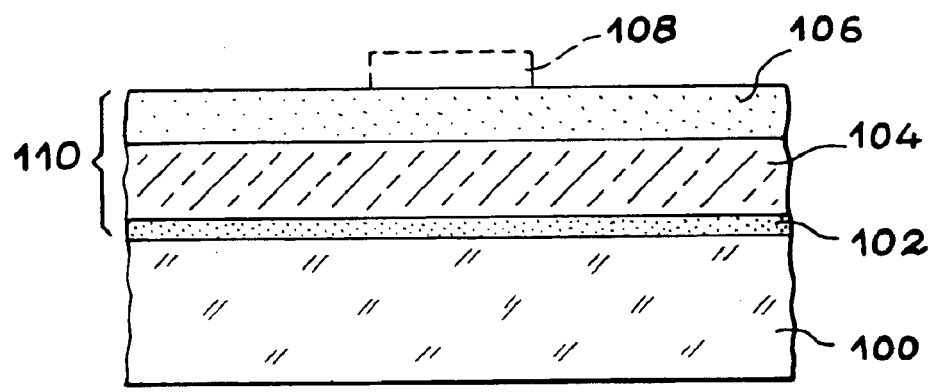
FIGS. 1 to 3 are illustrations, in the form of diagrammatic cross-sections, showing the fabrication steps for a component with a dummy gate.

FIG. 1 shows a silicon substrate 100 whose surface has been oxidized in order to form a silicon oxide layer 102, a so-called pedestal layer.

On layer 102 are successively deposited a layer of polycrystalline or amorphous silicon 104, then a layer of silicon nitride 106. These layers together form a stack 110. The total thickness of layers 104 and 106 is in the order of 100 to 300 nm for example, and substantially corresponds to the thickness of the transistor gate which is finally obtained at the end of the method of fabrication.

An etching mask 108, shown in a dashed line, such as a mask of photosensitive resin, is formed on layer 106 of silicon nitride. This mask defines the positioning, the size and the shape of a dummy gate which it is desired to fabricate in stack 110.

Layers 102, 104 and 106 of stack 110 are removed by etching, with the exception of a portion protected by the mask 108.

Figure 2:
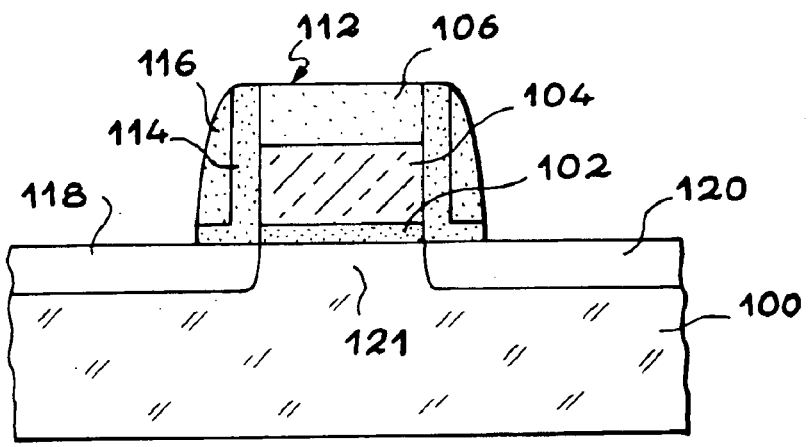

This portion of the stack forms the body of the dummy gate, referenced 112 in FIG. 2.

The formation of the dummy gate is followed by a first ion implantation at low dose. Depending upon whether the component it is desired to produce is of PMOS or NMOS type, the ions are chosen so as to make zones of p or n type conductivity. They may for example be boron ions for PMOS components and phosphorus or arsenic ions for NMOS components.

The first implantation is followed by the formation of side spacers 114, 116 on the side or sides of the dummy gate, visible in FIG. 2.

The side spacers comprise a first layer of silicon oxide 114 in contact with layers 104 and 106 of the dummy gate and a second, superficial, layer 116, of silicon nitride covering the oxide layer. The purpose of the first spacer layer 114 is essentially to limit contact stresses with the layers of material of the dummy gate, and especially with the polycrystalline silicone. It also limits the contact stresses with a small portion of substrate which it touches at the base of the dummy gate.

The role of the second spacer layer is essentially to protect the dummy gate from subsequent treatments in the method, in particular from oxidation treatments.

The formation of the side spacers may be made using techniques known in themselves which for the most part comprise the depositing of selected materials over the entire wafer, followed by anisotropic etching of these materials so as only to leave a small thickness on the sides of the dummy gate.

Optionally, after the formation of the side spacers, a second implanting of impurities may be conducted at a higher dose. The second implanting then uses the dummy gate, widened by the side spacers, as implantation mask. With this second implanting it is possible to obtain gradual source and drain regions 118, 120 in the substrate, with doping which decreases towards channel 121 located under the dummy gate 112. The gradual nature of the source and drain regions is not shown in the figures for reasons of clarity.

Figure 3:
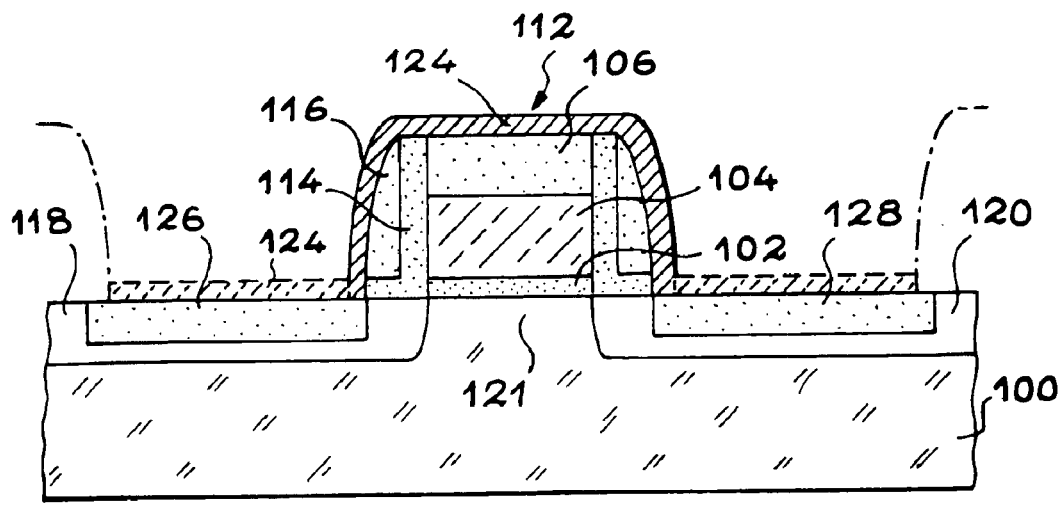

FIG. 3 shows a following step which consists of performing selective siliciding of the substrate in the source and drain regions. This operation comprises the depositing of a metal layer 124 such as, for example, titanium or nickel, followed by heat treatment at sufficient temperature to cause a siliciding reaction between the metal and silicon of the substrate.

Siliciding is qualified as selective insofar as it is limited to the zones in which the metal of layer 124 is directly in contact with silicon. It can be seen in FIG. 3 that the metal layer 124 has disappeared above the source and drain regions to form superficial layers of silicide 126, 128. On the other hand, the metal layer 124 persists on the top and sides of the dummy gate 112. On these parts, the silicon nitride of layers 106 and 116 of the dummy gate and spacers has prevented siliciding.

FIG. 3, slightly enlarged relative to FIG. 2, shows the possibility of pooling the source and drain with other components. In FIG. 3, the locations of the gates of other components have been outlined in a chain dotted line.

Figure 4:
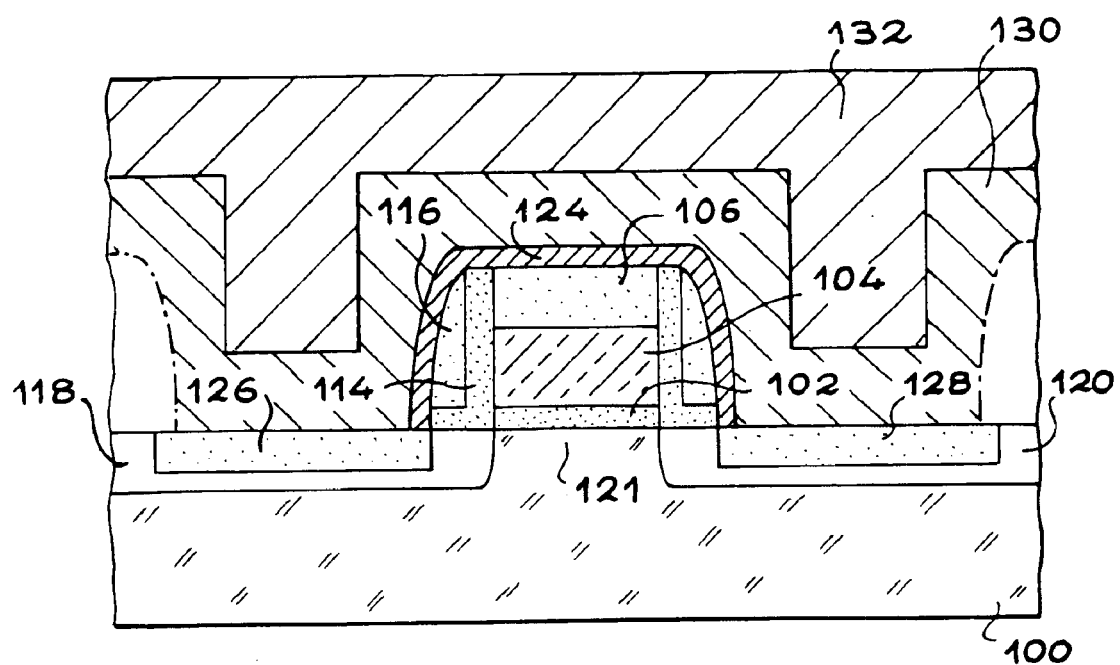
FIGS. 4 to 5 are cross-section diagrams illustrating the formation of source and drain accesses for a component according to FIG. 3.

FIG. 4 shows the formation of low resistivity accesses to the source and drain regions. This operation comprises the conforming deposit of a first, so-called contact, metal layer 130 followed by a second contact metal layer 132. The first contact metal may be chosen from among tungsten or titanium for example.

The second contact metal, preferably chosen to have greater resistance to abrasion than the first contact metal, may for example be chosen from among tantalium, tantalium nitride, titanium nitride, . . . .

In the illustrated example, the overall thickness of the two layers of contact metal totals the height of the dummy gate or more, so that it is subsequently possible to perform polishing, stopping at the dummy gate.

Figure 5:
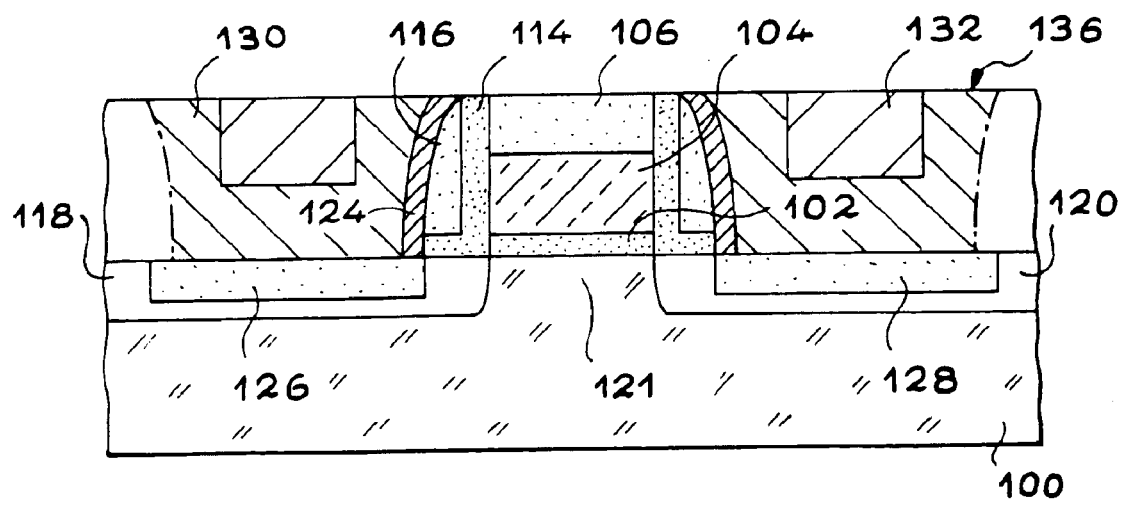

The result of polishing is shown in FIG. 5. It can be seen that polishing is stopped precisely at the second layer 106 of material of the dummy gate, in this case the layer of silicon nitride.

The siliciding metal layer 124 comes to be removed from the top part of the dummy gate, and electric insulation of the source and drain regions can be obtained. It is recalled that, outside the active region, whose length is generally smaller than the length of the gate in a direction perpendicular to the plane of the figures, it is possible to use appropriate etching, in known manner, to fix the limits of the conductor parts and hence to avoid any short-circuiting between these parts. In addition, insulation is also obtained by means of an oxidation as described below, with reference to FIG. 6 and conducted during a subsequent step of the method.

Through the use of two different contact materials, an upper surface 136 with good planarity can be obtained.

Figure 6:
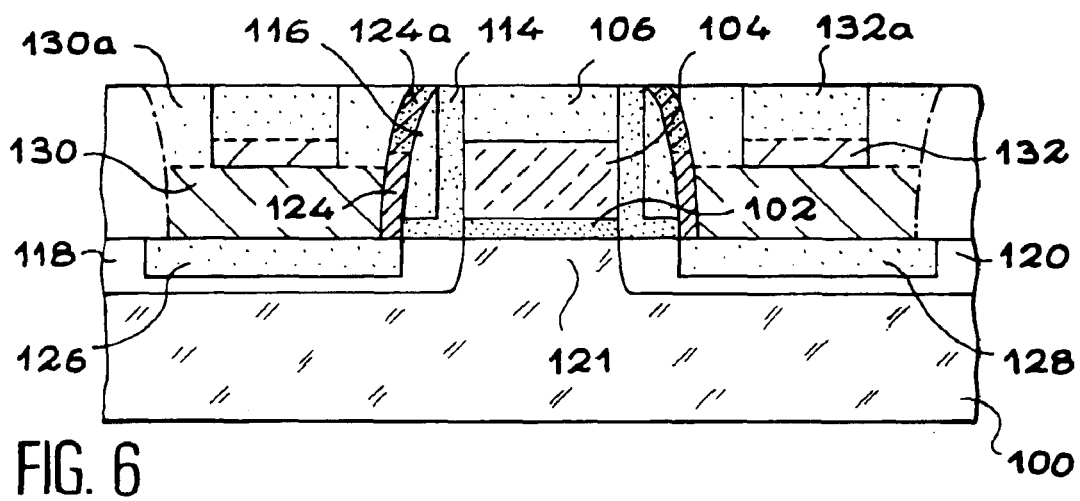
FIG. 6 is a cross-section diagram of a component according to FIG. 5 and illustrates an electric insulating step of the source and drain accesses.

FIG. 6 shows a subsequent step which consists of imparting an insulating nature to the materials flush with the upper surface 136. During this step, oxidation is performed by subjecting the structure to an oxidizing atmosphere. Oxidation particularly concerns the contact metals already mentioned in the preceding description. To facilitate the reading of FIG. 6, the oxidized parts are marked with the same references as the corresponding non-oxidized parts but are followed by the letter a. The oxidized parts 124a, 130a and 132a are therefore respectively the oxidized superficial parts of the metal preserved on the sides of the gate, and initially used for siliciding the first contact metal and the second contact metal. Their oxidation imparts an electric insulating nature to the metals.

Figure 7:
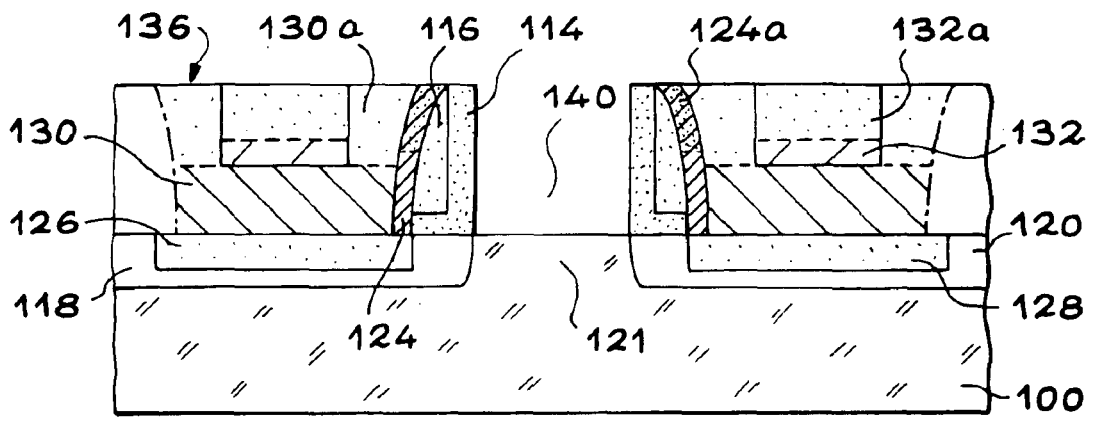
FIGS. 7 to 9 are cross-section diagrams illustrating the replacement of the dummy gate by a final gate.

FIG. 7 shows the structure obtained after removal of the dummy gate. Removal is made by selectively attacking the silicon nitride of the second layer 106 of the dummy gate, then by attacking the polycrystalline silicon of the first layer. At the time of this etching, the oxide layer of pedestal 102 may be used as etching stop. This layer is then also removed. The etching agents used may for example be HBr or $SF_6$ for etching silicon nitride, and $HBr+Cl_2$ for etching the polycrystalline silicon. The oxide may be removed with dilute HF. During this step, part of the layers 124a, 130a and 132a is also removed. Therefore, during the oxidation step in FIG. 6, the thickness of the oxide is sized so as to take into account this partial etching of layers 124a, 130a and 132a.

The removal of the dummy gate leaves behind a well denoted 140.

Figure 8:
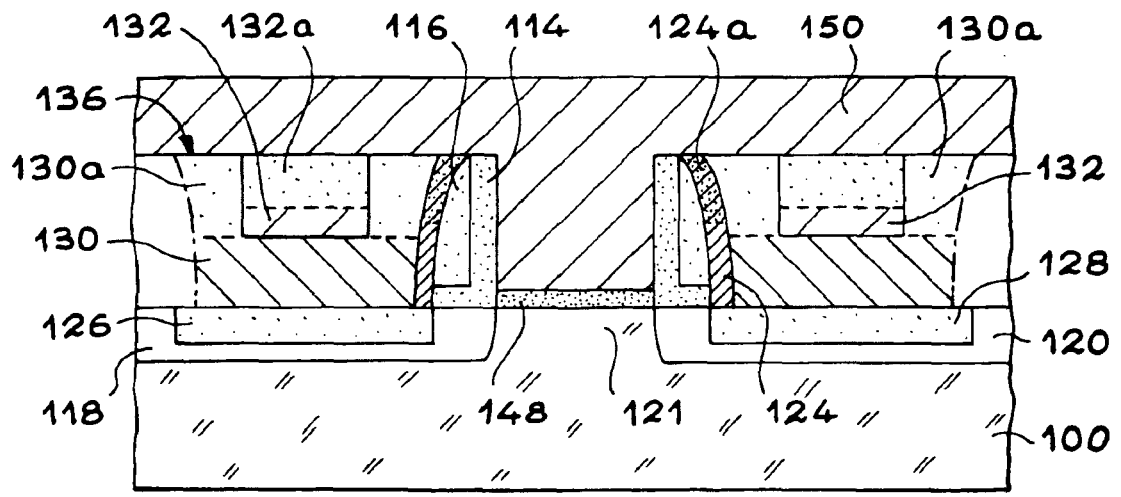

FIG. 8 shows the fabrication of the final gate. This operation comprises the formation of a gate insulating layer 148, for example by oxidizing the silicon of the underlying substrate, or by depositing a dielectric material, then depositing a layer of gate material 150, preferably in a metal chosen for example from among: W, TaN, W/TiN, Ti, TaN, Cu/TaN, W/Pt, N/Pt, W/Nb or W/RuCa.

Layer 150 may be a solid layer or optionally made up of a combination of two or more of the materials cited. The thickness of the layer or layers of gate 150 is sufficient to fill in the well left after removal of the dummy gate and to cover the upper plane surface 136 as defined by polishing.

Figure 9:
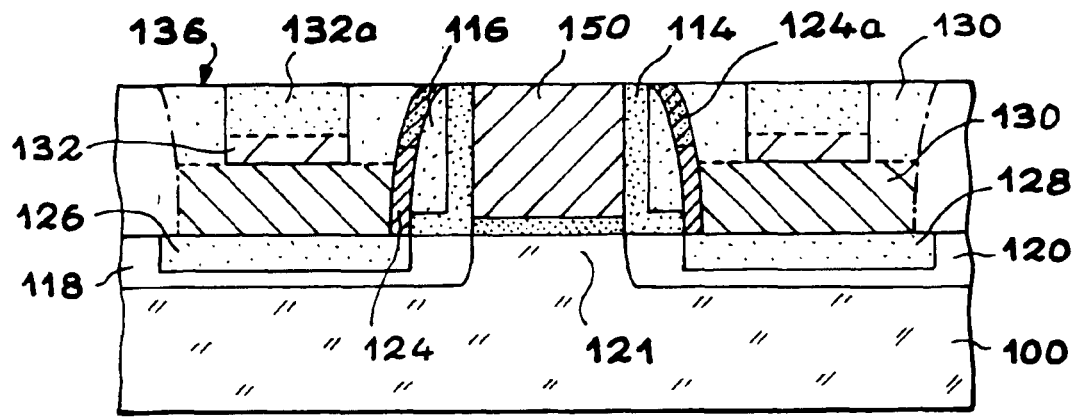

A second polishing operation, as shown in FIG. 9, makes it possible to remove the material of the gate layer 150 above the source and drain, so as only to maintain material in the well. The gate, which is flush with the upper surface 136, is also denoted 150. The end component obtained is a field-effect transistor and has a structure of damascene type.

The figures do not show the fabrication of contact pads on the gate, source and drain. These operations, well known in themselves in the field of microelectronics are not, in the strict sense of the word, part of the method of fabricating the transistor.

Figure 10:
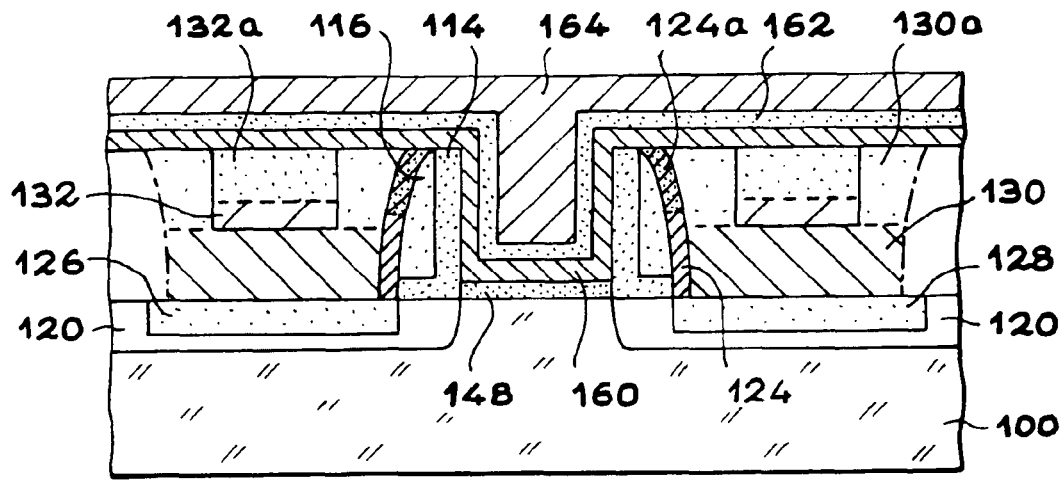
FIGS. 10 and 11 are cross-section diagrams illustrating a variant of the steps in FIGS. 8 and 9 for fabricating another type of component.
Figure 11:
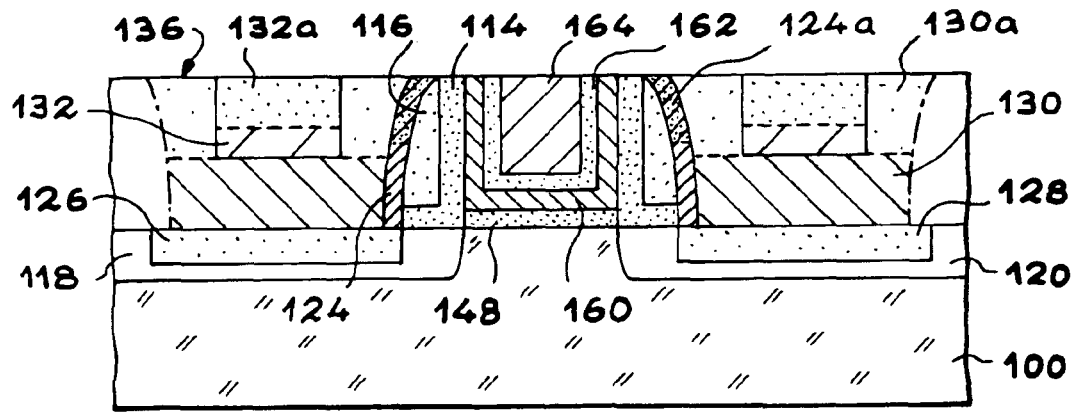

FIGS. 10 and 11 show the fabrication of another component, a memory in particular, using a structure such as described with reference to FIG. 7.

A first gate layer 160 whose thickness is less than the depth of the well 140 left by the dummy gate, that is to say less than the height of the removed dummy gate, is formed above gate insulating layer 148 which lines the bottom of the well. The first gate layer 160 also covers the upper free surface 136 of the structure.

Above the first gate layer an inter-gate dielectric layer 162 is deposited, whose thickness, added to the thickness of the first gate layer, is also less than the height of the dummy gate (removed).

Finally, a second gate layer 164 is deposited on the inter-gate layer 162. The thickness of the second gate layer is sufficient, together with the other deposited layers, to fill in the well left after removal of the dummy gate.

It is to be specified that the above-mentioned layers may each be formed of a stack of several sub-layers. In particular, the inter-gate layer 162 may be formed of a nitride/oxide/nitride stack chosen for having a particularly high dielectric constant. The materials chosen for the first and second gate layers may be those mentioned previously for the fabrication of the transistor gate.

Polishing of the gate and inter-gate layers, stopping at the metal oxides 124a, 130a, 132a, makes it possible to obtain a structure such as shown in FIG. 11. It can be seen that the first gate layer, and the inter-gate layer, have a U shape section along a plane parallel to the plane of the figure substantially extending in a source-gate-drain direction. The second gate layer 154 fills in the U shape.

With this particular shape it is possible to increase the surfaces opposite one another between the first and second gate layers without, however, increasing the surfaces opposite one another between the first gate layer and the substrate. Since the first and second gate layers, after polishing, respectively form the floating gate and the command gate of a memory, the structure in FIG. 11 provides a high capacity between the command gate and the floating gate and a low capacity between the floating gate and the channel (substrate). Since the source and drain access resistances are also very low on account of the use of the contact metal, high frequency functioning for the memory can be achieved, both for reading and for writing.

Figure 12:
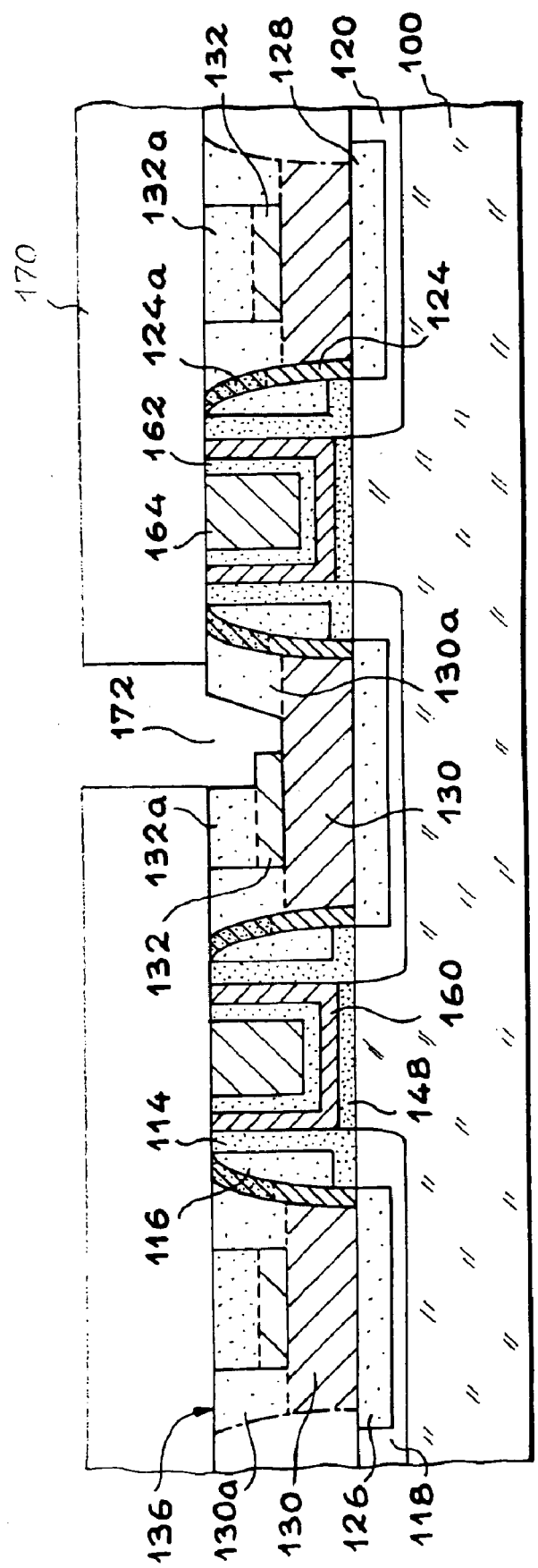
FIG. 12 is a cross-section view of a portion of an integrated circuit with components according to the invention, and illustrates the fabrication of an interconnection.

When a transistor or a memory such as described above are integrated into a circuit, contact points are made in the source, drain and gate regions. These comprise the formation of openings for example in the oxide layers which cover the source and drain, followed by the positioning of an interconnection metal in the openings to connect the non-oxidized contact metal to interconnection lines. Even though such operations no longer form part of the fabrication of the components and are well known in themselves, FIG. 12 illustrates an interconnection operation between the drain of a memory component such as previously described and a neighbouring component.

A layer of insulating material 170 such as $SiO_2$ is deposited on the free surface 136 of the components, that is to say the surface obtained by the last polishing. This layer prevents short-circuiting between an interconnection material (not shown) and other component parts.

An opening 172 made in the insulating layer 170 extends through the oxidized parts 130a, 132a of the first and second layers of contact metal to expose the non-oxidized parts 130, 132 of these layers. FIG. 12 shows that the alignment requirements of opening 172 in the insulating layer 170 are not very high. The opening only needs to coincide with the chosen source or drain region, without necessarily corresponding to the centre of this region. The fact that different materials are encountered when making opening 172 accounts for the staircase bottom of the opening as shown in FIG. 12.

Cited Documents

[1] FR-A-2 757 312
[2] FR-A-2 750 534

What is claimed is:

1. A method for fabricating an electronic component with a self-aligned source, drain and gate, comprising the steps of:

a) forming a dummy gate on a silicon substrate, said dummy gate defining a position for a channel of the component;

b) at least one implantation of doping impurities in the substrate, to form a source and a drain on either side of the channel, using the dummy gate as an implanting mask;

c) forming a metal layer on the source, drain and dummy gate:

d) superficial, self-aligned siliciding of the source and drain by selectively siliciding the metal layer on the source and drain;

e) depositing at least one contact metal layer having a total thickness greater than a height of the dummy gate, polishing the at least one contact metal layer stopping at the dummy gate, and imparting an insulation characteristic to a surface region of the at least one contact metal layer and the metal layer on sides of the gate electrode; and f) replacing the dummy gate by at least one final gate separated from the substrate by a gate insulating layer, and electrically insulated from the source and drain.

2. The method according to claim 1, wherein step e) comprises depositing a first metal layer and, above the first metal layer, a second metal layer having a greater mechanical resistance to polishing than the first metal layer, a thickness of the first metal layer being less than the height of the dummy gate, and a total thickness of the first and second metal layers being greater than the height of the dummy gate.

3. The method according to claim 2, wherein a metal of the first metal layer is chosen from among tungsten and titanium, and a metal of the second metal layer is chosen from among TaN, Ta and TiN.

4. The method according to claim 1, further comprising, before siliciding, forming side spacers on sides of the dummy gate.

5. The method according to claim 4, wherein the side spacers are formed comprising an attachment layer in silicon oxide, in contact with the dummy gate, and a superficial layer in silicon nitride.

6. The method according to claim 1, wherein the surface insulation comprises superficially oxidizing the at least one contact metal layer.

7. The method according to claim 1, wherein the silicon substrate comprises a solid substrate.

8. The method according to claim 1, wherein the silicon substrate comprises a silicon on insulator substrate.

9. The method according to claim 1, wherein step f) comprises removing the dummy gate, forming the gate insulating layer, depositing at least one metal layer to form the final gate, having an overall thickness equal to or greater than the height of the removed dummy gate.

10. The method according to claim 9, further comprising, after forming the gate insulating layer, depositing a first gate metal layer, depositing at least one inter-gate dielectric layer, and depositing a second gate metal layer.

11. The method according to claim 1, wherein the surface insulation comprises depositing a layer of dielectric material.

* * * * *